United States Patent
Mallozzi et al.

(10) Patent No.: US 8,024,025 B2
(45) Date of Patent: Sep. 20, 2011

(54) T1-CORRECTED PROTON RESONANCE FREQUENCY SHIFT THERMOMETRY

(75) Inventors: Richard Philip Mallozzi, Middleton, MA (US); Charles Lucian Dumoulin, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 695 days.

(21) Appl. No.: 12/114,888

(22) Filed: May 5, 2008

(65) Prior Publication Data

US 2009/0275821 A1    Nov. 5, 2009

(51) Int. Cl.
*A61B 5/05* (2006.01)
(52) U.S. Cl. ........ 600/412; 600/407; 600/410; 324/306; 324/309; 324/308; 382/128
(58) Field of Classification Search .......... 600/409–412; 324/307–318; 382/128
See application file for complete search history.

(56) References Cited

U.S. PATENT DOCUMENTS

| | | | |
|---|---|---|---|
| 5,307,812 A * | 5/1994 | Hardy et al. | 600/411 |
| 5,711,300 A * | 1/1998 | Schneider et al. | 600/412 |
| 6,377,834 B1 * | 4/2002 | Zhou et al. | 600/412 |
| 6,559,644 B2 | 5/2003 | Froundlich et al. | |
| 2002/0180438 A1 * | 12/2002 | Froundlich et al. | 324/315 |
| 2008/0146912 A1 * | 6/2008 | Richard et al. | 600/411 |

FOREIGN PATENT DOCUMENTS

WO    01/35825 A1    5/2001

* cited by examiner

*Primary Examiner* — Tse Chen
*Assistant Examiner* — Joel F Brutus
(74) *Attorney, Agent, or Firm* — Marie Claire B. Maple

(57) ABSTRACT

An apparatus and method for correcting magnetic resonance temperature measurements is disclosed. In one aspect, the method identifies monitoring regions of interest outside a therapeutic region of interest. Next, a pulse sequence sensitive to changes in T1 and proton density is used to measure the temperature changes in these regions. Next, the PRFS is measured in these same regions. The PRFS in these regions will be caused both by the desired shift from temperature change, and the undesired shift from background magnetic field changes. Using the measured temperature changes from the T1-method, the component of the PRFS due to actual temperature changes is subtracted from the PRFS method, leaving only the component caused by the unwanted magnetic field changes. This analysis is performed separately for each region. At the end of this step, one has measured the change in background magnetic field within each region.

4 Claims, 5 Drawing Sheets

T1-CORRECTED PROTON RESONANCE FREQUENCY SHIFT THERMOMETRY

BACKGROUND

This invention relates generally to systems and methods for imaging tissue using magnetic resonance imaging (MRI) techniques, and more particularly to obtaining high accuracy temperature measurements of a tissue mass by compensating for errors during the acquisition of MR images used for temperature measurement by applying a T1-based correction to the MR images.

In the past, ultrasound imaging has been used for both generating and positioning focused ultrasound waves on tissue to be destroyed. It was soon found that the MR images were much better suited for such guidance, since MR provides excellent images of tissue, and is not limited to "windows" that excludes bones, for example. Further, MRI system images are useful not only for guiding the actual surgical procedures, but also for planning the surgical procedures. In fact, a tumor is often much more visible in an MR image than as seen in actual surgery. In actual surgery, the tumor and normal tissues often look similar. In addition, during the surgery, the tumor can be obscured by blood. Presently, patients are first scanned in an MRI system to locate the tumor and plan a safe trajectory between the entry of the ultrasound radiation and the target points.

Certain types of tissues, such as cancerous tumors, can be destroyed by heat. It has further been discovered that the control of heat was improved by using short pulses such that the effect of blood profusion is made negligible. The state of the art has advanced to the point where the MRI system is used not only for planning the surgery, but also during the actual destruction of the cancerous tissue. The MRI system using separate scanning sequences provides temperature information and, in addition, also provides tissue information. Thus, the actual temperature of the tissue can be ascertained using magnetic resonance imaging methods, and in addition the ablation of the tissue can be observed using the MRI system.

One conventional way to heat these tissues is by directing laser energy into the tissue using, for example, a laser source carried by a catheter. Another conventional way is to focus high intensity, ultrasonic acoustic waves into the tissue using, for example, a phased-array of piezoelectric transducers. Both of these approaches can reduce or even eliminate the need for invasive surgery to remove the tissue.

Thus, the prior art performs thermal surgery guided by MRI systems and procedures to selectively destroy tumorous tissue in the patient with localized heating, without adversely affecting healthy tissue. The heat is applied to the tumor tissue in a pulsed or oscillating fashion. The pulsed energy creates a heat focus that heats either at the tip of the optical fiber, or at the focal point of the transducer, depending on the heat source. The heated tumorous region may be imaged with the use of the MRI systems, employing a temperature sensitive MR pulse sequence to acquire a temperature "map" that is used basically to assure that the heat is being applied to the tumorous tissue and not to the surrounding healthy tissue. This is done by applying a quantity of heat that is insufficient to cause necrosis but is sufficient to raise the temperature of the heated tissue. The MRI system temperature map shows whether or not the heat is applied to the previously located tumorous tissue. The imaging system is also used in a separate scan sequence to create an image of the tissue intended to be destroyed. Using the imaging system in the prior art, the operator of the apparatus adjusts the placement of the radiation on the site of the tissue to be destroyed. The MR image of the tumor acquired in the separate scan determines in real time if necrosis is occurring and effectively ablating the tumorous tissue. However, the monitoring and guiding are provided using separate two-dimensional scan sequences.

When laser beams are used as the heat source, then mechanical means are used to position the optical fiber carrying the laser beam to the diseased tissue to accurately position it within the diseased tissue. When ultrasound beams are used as the heat source, then the focus of the ultrasound beams can be positioned either by mechanically moving the ultrasound generator to move its focal point, or a phased array ultrasound system can be used to manipulate the position of the focal point so that it is within the diseased tissue that is to be destroyed by heating.

Of critical importance to the process is verifying that a sufficient temperature was reached during each application of ultrasonic energy to kill the target tissue structure, or portion thereof being heated. This can be done by measuring the temperature change (rise) of the portion of the tissue structure being heated during the heating process using MR imaging techniques.

There are several MRI methods that have been used in the past for measuring temperatures using well-known MRI parameters, such as the spin-lattice relaxation time T1, the time to repeat (TR), the time to echo TE, and the flip angle. For example, temperature maps can be generated based on such procedures that provide T1 derived images evaluated with fast spoiled gradient echo sequences applied during the actual thermal therapy exposure. The parameters used are to some degree based on the tissue type and the precise evaluation of the behavior due to physiological or metabolic changes in the tissue during thermal therapy exposure. For example, TE, TR and the flip angle of the spoiled gradient echo have been used for localizing the low-temperature elevation induced by a focused ultrasound beam during both the planning and treatment.

Another known method of measuring temperature change using MR techniques exploits the temperature dependence of the proton resonant frequency (PRF) in water. The temperature dependence of the PRF is primarily due to temperature-induced induced rupture, stretching, or bending of the hydrogen bonds in water. The temperature dependence of pure water is 0.0107 ppm/° C., and the temperature dependence of other water-based tissues is close to this value.

Because of a non-homogenous magnetic field within the MR image, absolute PRF measurements are not possible. Instead, changes in PRF are measured by first taking a MR image before the delivery of heat, and subtracting this baseline value from subsequent measurements. Notably, the total imaging time must be kept relatively short for the baseline value to remain relatively stable, since drifts in the magnetic field can occur over time.

The temperature-induced changes in PRF are then estimated by measuring changes in phase of the MR signal, or proton resonance frequency shift (PRFS) in certain MR imaging sequences. Unfortunately, movements of the object being imaged or dynamic changes in magnetic field intensity and/or uniformity during the MR imaging process (i.e., between successively acquired images) can also induce phase shifts, which can be misinterpreted as a temperature-induced phase shift. As a result, a given phase shift might be attributable to any one of temperature change, motion, changes in magnetic field, or some combination thereof, between acquired images. This ambiguity makes it difficult to determine the tissue mass temperature change relying only on the MR signals from the tissue mass being heated. Such motion and non-uniform field "distortion" may have differing sources acting alone or in combination, such as patient motion, breathing or other dynamic organ movement (e.g., the heart), or blood moving through a blood vessel located in or adjacent to the target tissue region.

Another method is known as self-referencing or reference-less thermometry. In this method, tissue outside the therapeutic zone (tissue being heated) is used to measure the PRFS. Assuming this tissue does not heat, then the PRFS in these regions is due only to changes in magnetic field. Unfortunately, the temperature is these regions often do change, rendering the method ineffective.

Another method being developed is to use nearby fat tissue as a reference. Fat tissue does not experience a PRFS with temperature change, so that any temperature-induced changes in PRF are due to background field changes. The limitation here is that one may not have enough fatty tissues around to perform this correction.

In view of the foregoing, the problem of performing accurate measurement of temperature changes in tissue in an MRI system remains one of the biggest barriers to widespread use of the PRF method in temperature imaging. Therefore, it would be desirable to provide a system and method that accurately measures the temperature changes in tissue in an MRI system.

BRIEF DESCRIPTION

Briefly, in one aspect of the invention a method of correcting magnetic resonance temperature measurements, comprising the steps of:
determining a proton resonance frequency (PRF) reference phase map of a therapeutic region of interest and at least one PRF monitoring region of interest;
determining a spin-lattice relaxation time T1 reference map of at least one T1 monitoring region of interest;
repeatedly acquiring a phase map of the therapeutic region of interest and the at least one PRF monitoring region of interest;
determining an apparent change of temperature of the therapeutic region of interest and the at least one PRF monitoring region of interest based on the proton resonance frequency (PRF) reference phase map;
intermittently acquiring an updated T1 reference map of the at least one T1 monitoring region of interest;
determining an apparent change of temperature of the at least one T1 monitoring region of interest based on the updated T1 reference map;
computing a phase correction map from the apparent change of temperature of the at least one T1 monitoring region of interest based on the updated T1 reference map;
updating the PRF reference phase map by incorporating the computed phase correction map; and
applying the updated PRF reference phase map to correct the magnetic resonance temperature measurement of the apparent change in temperature of the therapeutic region of interest.

In another aspect of the invention, a method of correcting magnetic resonance temperature measurements, comprising the steps of:
determining a proton resonance frequency (PRF) reference phase map of a therapeutic region of interest and at least one PRF monitoring region of interest;
determining a spin-lattice relaxation time T1 reference map of at least one T1 monitoring region of interest;
repeatedly acquiring a T1-based temperature map of the therapeutic region of interest and the at least one T1 monitoring region of interest;
determining an apparent change of temperature of the therapeutic region of interest and the at least one T1 monitoring region of interest based on the spin-lattice relaxation time T1 reference map;
intermittently acquiring an updated PRF reference map of the at least one PRF monitoring region of interest;
determining an apparent change of temperature of the at least one PRF monitoring region of interest based on the updated PRF reference map;
computing a T1 correction map from the apparent change of temperature of the at least one PRF monitoring region of interest based on the updated PRF reference map;
updating the T1-based temperature map by incorporating the computed T1 correction map; and
applying the updated T1-based temperature map to correct the magnetic resonance temperature measurement of the apparent change in temperature of the therapeutic region of interest.

DRAWINGS

These and other features, aspects, and advantages of the present invention will become better understood when the following detailed description is read with reference to the accompanying drawings in which like characters represent like parts throughout the drawings, wherein.

Figure 5C:
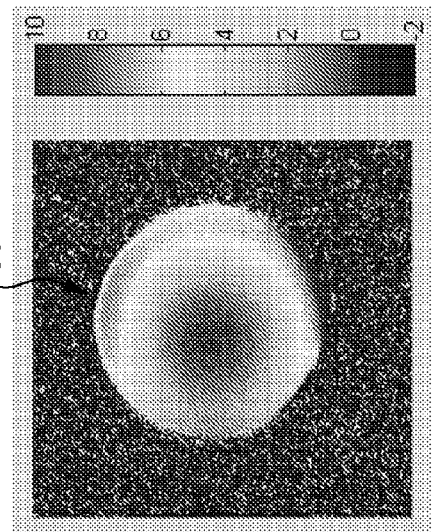
Figure 5B:
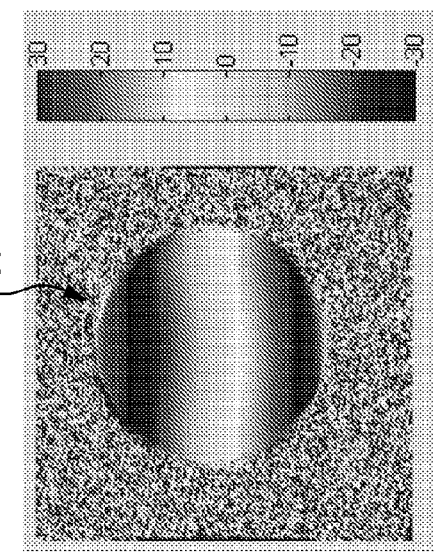
Figure 5A:
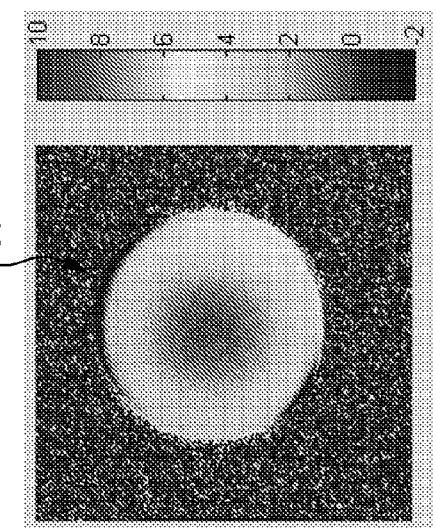

FIGS. 5(a)-5(c) are photographs of a water specimen when placed in a magnetic field with no field disturbance, the water specimen when exposed to a strong magnetic field disturbance, and the water specimen when exposed to the strong magnetic field disturbance and after application of the T1-corrected PRFS thermometry method of the invention.

Figure 6:
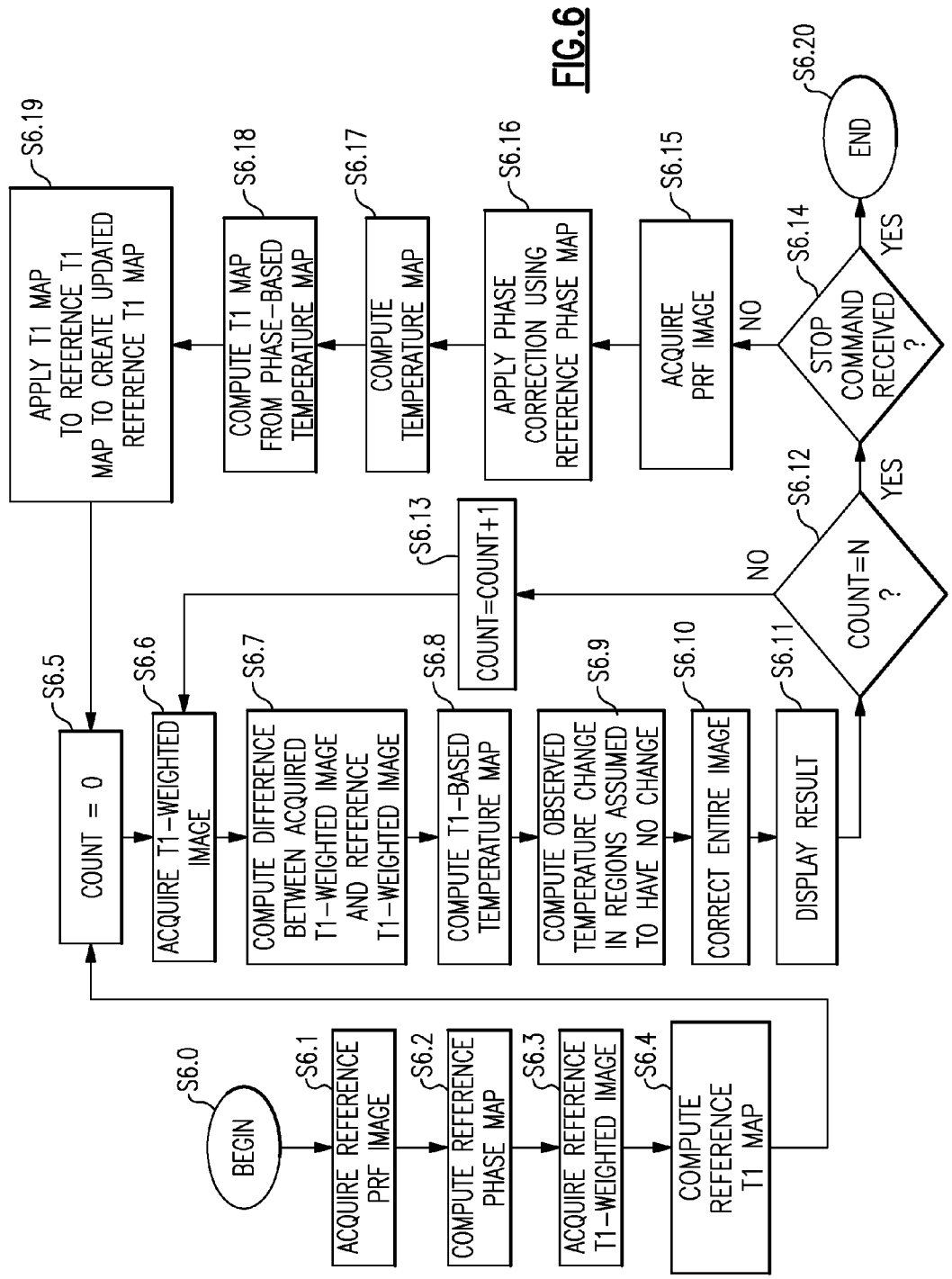

FIG. 6 is a flowchart of T1-corrected proton resonance frequency shift (PRFS) thermometry according to an alternate exemplary method of the invention.

DETAILED DESCRIPTION

Figure 1:
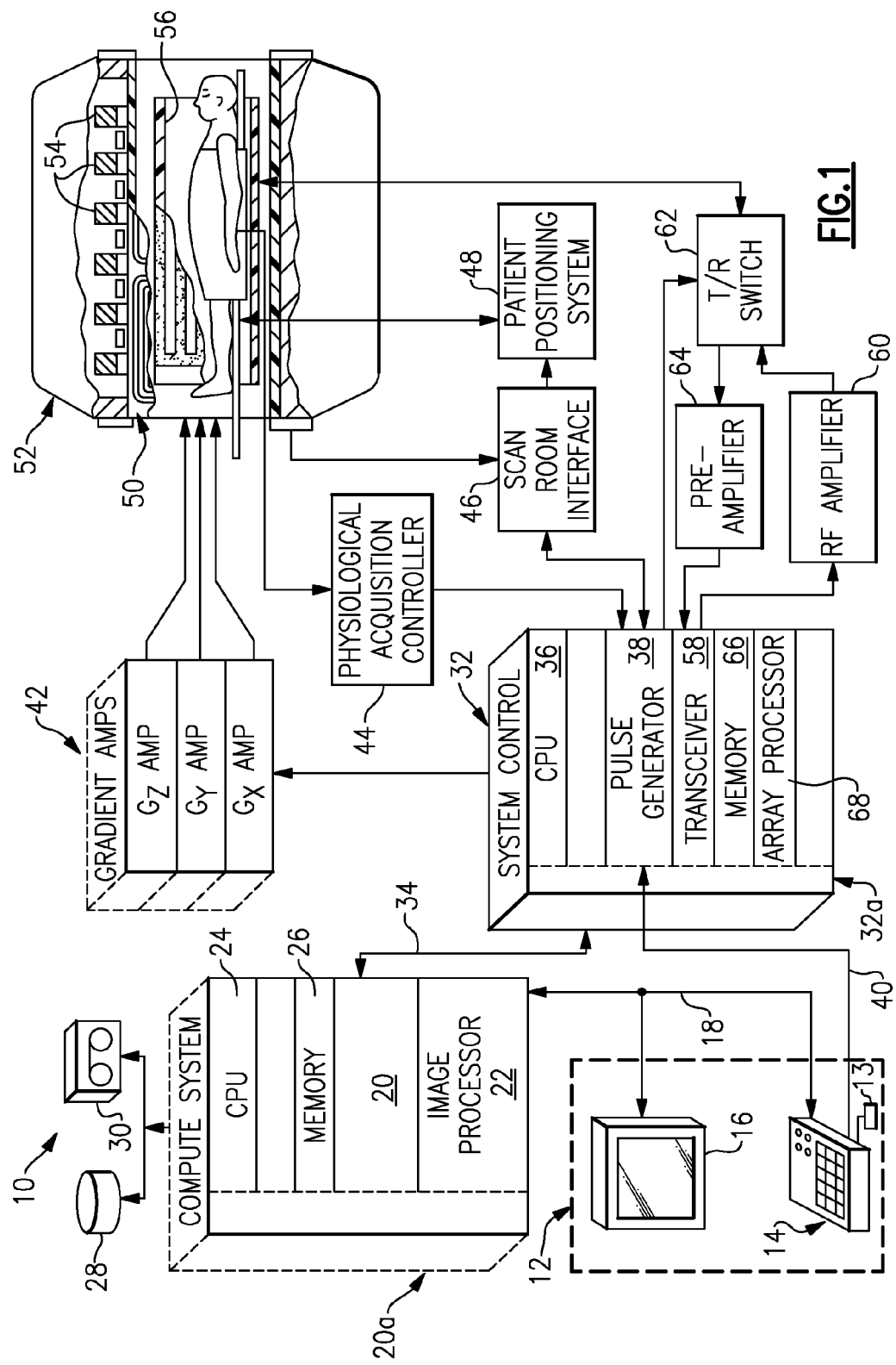
FIG. 1 is a schematic block diagram of a superconducting magnet system that in an example comprises an MR apparatus.

Referring to the drawings wherein identical reference numerals denote the same elements throughout the various views, Referring to FIG. 1, a magnetic resonance imaging (MRI) apparatus 10 comprises a superconducting magnet system. An illustrative discussion of exemplary details of a magnetic resonance and/or magnetic resonance imaging (MRI) apparatus and/or system are presented for explanatory purposes only.

The operation of the MR apparatus is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20*a*. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32*a*. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. Gradient coil assembly 50 is housed in a magnet assembly 52 that includes a set of superconducting magnet windings 54, the gradient coil assembly 50 and a whole-body RF coil 56. In general, the gradient coil assembly 50 includes a plurality (three-dimensions) of gradient coils separated by an epoxy material. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Currently, a method of measuring temperature change using MR techniques exploits the temperature dependence of the proton resonance frequency (PRF) in water. The temperature dependence of the PRF is primarily due to temperature-induced rupture, stretching, or bending of the hydrogen bonds in water. The proton resonance frequency shift (PRFS) of pure water is about 0.0107 ppm/° C., and the temperature dependence of other water-based tissues is close to this value. However, the PRFS method is confounded by changes in the background magnetic field, which leads to resonance frequency shifts independent of temperature. One aspect of the invention is to augment the PRFS method with another known temperature imaging method based on the temperature dependence of the spin-lattice relaxation time T1 to significantly reduce error in the PRFS temperature measurement that is caused by changes in the background magnetic field.

Figure 2:
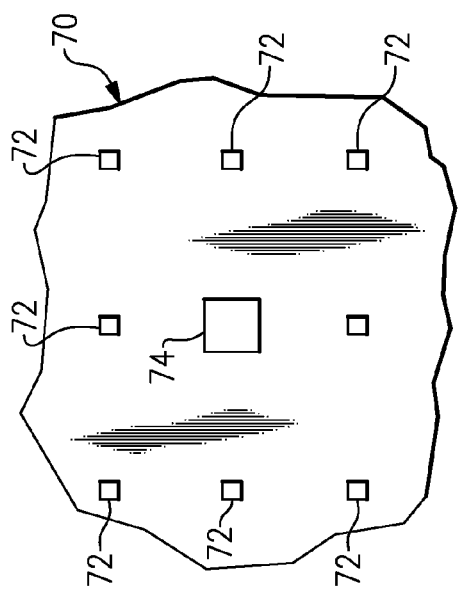
FIG. 2 is a diagram of a therapeutic region of interest (ROI) and several neighborhood monitoring regions of interest (ROIs).

In general, the method of the invention performs MRI temperature measurements using T1-corrected proton resonance frequency shift (PRFS) by identifying regions-of-interest (ROI). As shown in FIG. 2, the ROI are located within a region 70 that contains one or more monitoring ROI(s) 72 and a therapeutic ROI 74. The one or more monitoring ROI(s) 72 are areas of the region 70 that are not being treated with a temperature change (either heated or cooled), while the therapeutic ROI 74 is the area of the region 70 that is being treated with a temperature change (either heated or cooled). The region 70 containing the monitoring ROI(s) 72 and the therapeutic ROI 74 can have any desirable area, so long as the monitoring ROI(s) 72 and the therapeutic ROI 74 are located therein.

Figure 3:
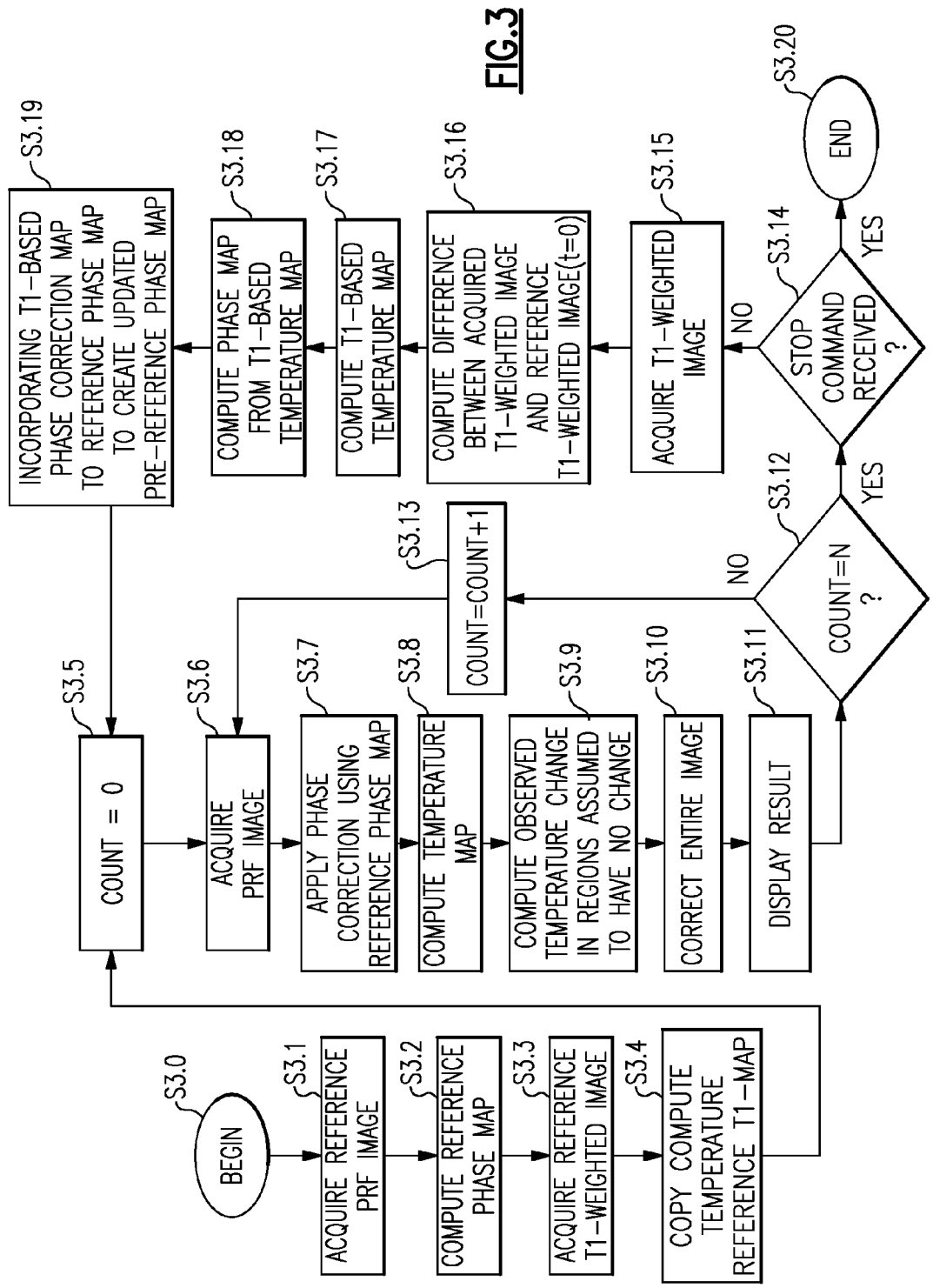
FIG. 3 is a flowchart of T1-corrected proton resonance frequency shift (PRFS) thermometry according to an exemplary method of the invention.

Referring now to FIG. 3, an embodiment of the method of the invention will now be described. The method begins at Step S3.0 (t=0). Then, the computer system 20 acquires a reference PRF image in Step S3.1, and computes a PRF reference phase map in Step S3.2 Next, a reference T1-weighted image is acquired in Step S3.3, and a T1-based reference temperature map is computed in Step S3.4. Next, a counter is set equal to zero in Step S3.5. Then, a PRF image is acquired by the MRI apparatus 10 in Step S3.6, and a phase correction to the image acquired in Step S3.6 is applied in Step S3.7 by using the phase reference map from Step S3.2. Next, a temperature map is computed by the computer system 20 using well-known techniques in Step S3.8. Then, the temperature change in the monitoring ROI(s) 72 is computed in Step S3.9, and the entire image is corrected in Step S3.10. The PRFS in the ROI(s) 72, 74 will be caused both by the desired shift from temperature change and the undesired shift from background magnetic field changes. The results are displayed on display screen 16 in Step S3.11.

Then, the computer system 20 determines whether the counter is equal to a predetermined counter value, N, in Step S3.12. The predetermined counter value determines an increment of time for the method of the invention to perform the T1 correction of the image. If not, then the counter is incremented by 1 in Step S3.13 and the method proceeds to Step S3.6 to acquire the next PRF image. Steps S3.7-S3.11 are repeated until the counter equals the predetermined counter value in Step S3.12.

Figure 4:
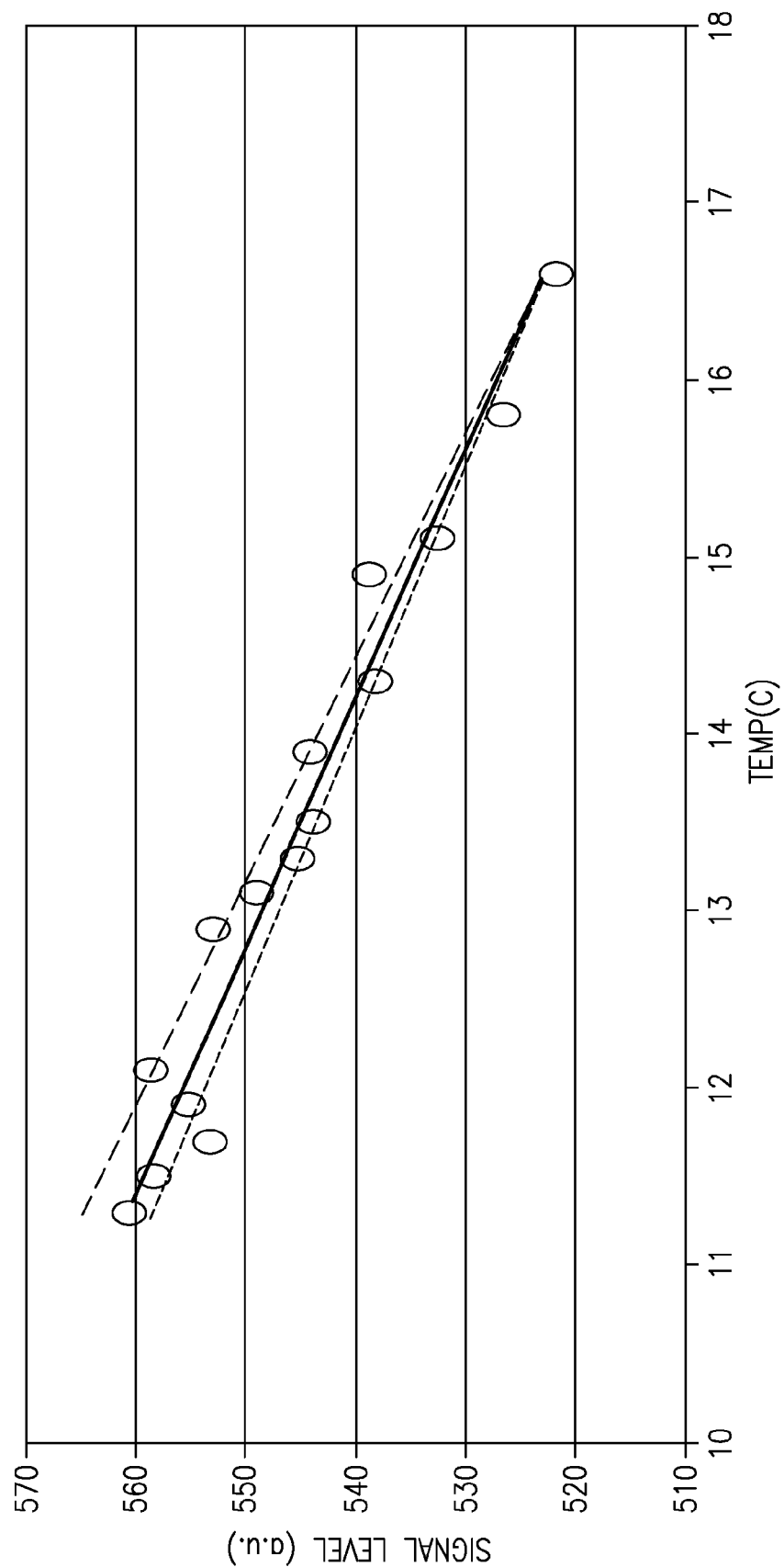
FIG. 4 is a graph of signal level as a function of temperature that demonstrates the signal sensitivity from T1 and spin polarization sensitivity.

Once the counter equals the predetermined counter value, N, in Step S3.12, then the method determines whether a stop command has been received by the computer system 20 in Step S3.14. If not, then the method proceeds to acquire a T1-weighted image in Step S3.15. Voxels in these regions can be larger than voxels typically are in a PRF temperature measurement, thereby leading to improved sensitivity. Next, a difference between the acquired T1-weighted image from Step S3.15 and the reference T1-weighted image from Step S3.3 is computed in Step S3.16. As shown in FIG. 4, this can be achieved by determining a change in signal level intensity as a function of temperature, which is about 1.3%/° C. Then, an adjusted T1-based temperature map is computed in Step S3.17, and a phase map from the T1-based temperature map is computed based on a zero, first or higher-order polynomial in Step S3.18. Next, the phase map from the T1-based temperature map in Step S3.18 is incorporated into the PRF reference phase map to create an updated PRF reference phase map in Step S3.19. In other words, the method of the invention uses the measured temperature changes from the T1-based temperature map to subtract the component of the PRFS due to actual temperature changes from the PRFS image in Steps S3.6-S3.11, leaving only the component caused by the unwanted magnetic field changes. This analysis is performed separately for each ROI 72, 74 within the region 70. At the end of Step S3.19, one has measured the change in background magnetic field within each ROI 72, 74.

The method then proceeds to Step S3.5 and the counter is reset to zero. Steps S3.6-S3.11 are repeated until the counter equals the predetermined counter value, N, in Step S3.12. If so, then the method proceeds to Step S3.14 to determine whether a stop command has been received. If not, then the Steps S3.15-S3.19 are repeated to apply T1-based temperature correction to the PRF image obtained in Steps S3.6-S3.11. If so, then the method ends at Step S3.20. Thus, the T1-based temperature correction in Steps S3.15-S3.19 needs to be performed only intermittently, depending on the predetermined counter value. Therefore, the T1-based temperature correction to the PRFS temperature measurements is useful because the T1-based temperature correction does not need to be as fast or high-resolution as the PRFS temperature measurements.

Referring now to FIGS. 5(a)-(c), the method of the invention was tested on a water specimen. In FIG. 5(a), the water specimen was placed in a magnetic field with no magnetic field disturbance and a phase-sensitive image 80 was acquired. In FIG. 5(b), the water specimen was exposed to a strong magnetic field gradient applied along the Y axis of the magnet with no T1-based temperature correction. FIG. 5(c) shows the water specimen that was exposed to the strong magnetic field disturbance of FIG. 5(b) after application of the T1-corrected PRFS thermometry method of the invention. As seen in FIG. 5(c), the T1-corrected PRFS thermometry method shows a significant reduction of error associated with the strong magnetic field disturbance.

As described above, the method of the invention shown in FIG. 3 intermittently creates an updated PRF reference phase map from a phase map that has been computed from a T1-based temperature correction map. FIG. 6 shows an alternative method of the invention in which an updated T1-reference phase map is created from a computed PRF-based phase temperature correction map.

The alternative method begins at Step S6.0. Then, the computer system 20 acquires a reference PRF image in Step S6.1, and computes a phase reference map in Step S6.2 Next, a reference T1-weighted image is acquired in Step S6.3, and a reference T1 temperature map is computed in Step S6.4. Note that Steps S6.1-S6.4 are identical to Steps S3.1-S3.4. Next, a counter is set equal to zero in Step S6.5. Then, a T1-weighted image is acquired by the image processor 22 in Step S6.6. Voxels in these regions can be larger than voxels typically are in a PRF temperature measurement, thereby leading to improved sensitivity. Next, a difference between the acquired T1-weighted image from Step S6.6, and the reference T1-weighted image from Step S6.3 is computed in Step S6.7. As shown in FIG. 4, this can be achieved by determining a change in signal level intensity as a function of temperature, which is about 1.3%/° C. Then, a T1-based temperature map is computed in Step S6.8, and the temperature change in the monitoring ROI(s) 72 is computed in Step S6.9, and the entire image is corrected in Step S6.10. The T1 changes in the ROI(s) 72, 74 will be caused by the desired shift from temperature change. The results are displayed on display screen 16 in Step S6.11.

Then, the computer system 20 determines whether the counter is equal to a predetermined counter value in Step S6.12. The predetermined counter value determines an increment of time for the method of the invention to perform the PRFS correction of the image. If not, then the counter is incremented by 1 in Step S6.13 and the method proceeds to Step S6.6 to acquire the next T1-weighted image. Steps S6.7-S6.11 are repeated until the counter equals the predetermined counter value in Step S6.12.

Once the counter equals the predetermined counter value in Step S6.12, then the method determines whether a stop command has been received by the computer system 20 in Step S6.14. If not, then the method proceeds to acquire a PRF image in Step S6.15. Next, a phase correction is applied in Step S6.16 using the PRF reference phase map from Step S6.2, and a temperature map is computed in Step S6.17. A T1-based temperature map is computed from the PRF phase-based temperature map in Step S6.18. Next, an intensity correction computed from the PRF phase-based temperature map in Step S6.18 is applied to the T1-based temperature map to create an updated T1-based temperature map in Step S6.19. This analysis is performed separately for each ROI 72, 74 within the region 70. At the end of Step S6.19, one has measured the change in background magnetic field within each ROI 72, 74.

The method then proceeds to Step S6.5 and the counter is reset to zero. Steps S6.6-S6.11 are repeated until the counter equals the predetermined counter value, N, in Step S6.12. If so, then the method proceeds to Step S6.14 to determine whether a stop command has been received. If not, then the Steps S6.15-S6.19 are repeated to apply PRF phase-based temperature correction to the T1 image obtained in Steps S6.6-S6.11. If so, then the method ends at Step S6.20. Thus, the PRF phase-based temperature correction in Steps S6.15-S6.19 needs to be performed only intermittently, depending on the predetermined counter value, N.

As described above, the one method of the invention provides for a system and method in which the PRFS phased-based method is augmented by using another temperature imaging methods based on the temperature dependence of T1 to significantly reduce error in the PRFS measurement that are caused by changes in the background magnetic field changes. An alternate method of the invention provides for a system and method in which the T1 temperature-based method is augmented by using another temperature imaging method based on the temperature dependence of PRFS to significantly reduce error in the PRFS measurement.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of correcting magnetic resonance temperature measurements, comprising the steps of:
    determining a proton resonance frequency (PRF) reference phase map of a therapeutic region of interest and at least one PRF monitoring region of interest;
    determining a spin-lattice relaxation time T1 reference map of at least one T1 monitoring region of interest;
    repeatedly acquiring a phase map of the therapeutic region of interest and the at least one PRF monitoring region of interest;
    determining an apparent change of temperature of the therapeutic region of interest and the at least one PRF monitoring region of interest based on the proton resonance frequency (PRF) reference phase map;
    intermittently acquiring an updated T1 reference map of the at least one T1 monitoring region of interest;
    determining an apparent change of temperature of the at least one T1 monitoring region of interest based on the updated T1 reference map;
    computing a phase correction map from the apparent change of temperature of the at least one T1 monitoring region of interest based on the updated T1 reference map;
    updating the PRF reference phase map by incorporating the computed phase correction map; and
    applying the updated PRF reference phase map to correct the magnetic resonance temperature measurement of the apparent change in temperature of the therapeutic region of interest.

2. The method of claim 1, wherein the at least one PRF monitoring region of interest is the same as the at least one T1 monitoring region of interest.

3. A method of correcting magnetic resonance temperature measurements, comprising the steps of:
    determining a proton resonance frequency (PRF) reference phase map of a therapeutic region of interest and at least one PRF monitoring region of interest;
    determining a spin-lattice relaxation time T1 reference map of at least one T1 monitoring region of interest;
    repeatedly acquiring a T1-based temperature map of the therapeutic region of interest and the at least one T1 monitoring region of interest;
    determining an apparent change of temperature of the therapeutic region of interest and the at least one T1 monitoring region of interest based on the spin-lattice relaxation time T1 reference map;
    intermittently acquiring an updated PRF reference map of the at least one PRF monitoring region of interest;
    determining an apparent change of temperature of the at least one PRF monitoring region of interest based on the updated PRF reference map;
    computing a T1 correction map from the apparent change of temperature of the at least one PRF monitoring region of interest based on the updated PRF reference map;
    updating the T1-based temperature map by incorporating the computed T1 correction map; and
    applying the updated T1-based temperature map to correct the magnetic resonance temperature measurement of the apparent change in temperature of the therapeutic region of interest.

4. The method of claim 3, wherein the at least one T1 monitoring region of interest is the same as the at least one PRF monitoring region of interest.

* * * * *